(12) United States Patent
Braceras et al.

(10) Patent No.: US 7,643,357 B2
(45) Date of Patent: Jan. 5, 2010

(54) SYSTEM AND METHOD FOR INTEGRATING DYNAMIC LEAKAGE REDUCTION WITH WRITE-ASSISTED SRAM ARCHITECTURE

(75) Inventors: George M. Braceras, Essex Junction, VT (US); Steven H. Lamphier, Colchester, VT (US); Harold Pilo, Underhill, VT (US); Vinod Ramadurai, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 12/032,798

(22) Filed: Feb. 18, 2008

(65) Prior Publication Data

US 2009/0207650 A1    Aug. 20, 2009

(51) Int. Cl.
G11C 5/14 (2006.01)
G11C 11/00 (2006.01)

(52) U.S. Cl. .................. 365/189.09; 365/154; 365/156; 365/226

(58) Field of Classification Search ............. 365/189.09
See application file for complete search history.

(56) References Cited

U.S. PATENT DOCUMENTS

| | | | |
|---|---|---|---|
| 4,926,383 A | 5/1990 | Kertis et al. | |
| 5,058,067 A | 10/1991 | Kertis | |
| 5,715,191 A * | 2/1998 | Yamauchi et al. | 365/156 |
| 5,910,922 A | 6/1999 | Huggins et al. | |
| 6,738,305 B1 | 5/2004 | Liaw | |
| 6,798,688 B2 * | 9/2004 | Joshi | 365/154 |
| 6,804,143 B1 | 10/2004 | Hobson | |
| 7,113,421 B2 | 9/2006 | Maeda et al. | |
| 7,515,489 B2 * | 4/2009 | Wong | 365/189.09 |
| 2003/0189849 A1 * | 10/2003 | Khellah et al. | 365/200 |
| 2005/0128790 A1 | 6/2005 | Houston | |

OTHER PUBLICATIONS

Zhang, K. et al., "A 3-GHz 70Mb SRAM in 65nm CMOS Technology with Integrated Column-Based Dynamic Power Supply," International Solid-State Circuits Conference 2005: Session 26, Feb. 9, 2005, pp. 474-475, 611.
Bhavnagarwala Azeez J. et al., "A Transregional CMOS SRAM with Single, Logic Vdd and Dynamic Power Rails," IEEE 2004 Symposium on VLSI Circuits Digest of Technical Papers; Jun. 18, 2004; pp. 292-293.

* cited by examiner

*Primary Examiner*—Son L Mai
(74) *Attorney, Agent, or Firm*—Cantor Colburn LLP; Michael LeStrange

(57) ABSTRACT

A system for integrating dynamic leakage reduction with a write-assisted SRAM architecture includes power line selection circuitry associated with each column of one or more SRAM sub arrays, controlled by a selection signal that selects the associated sub array for a read or write operation, and by a column write signal that selects one of the columns of the sub arrays. The power line selection circuitry locally converts a first voltage, corresponding to a cell supply voltage for a read operation, to a second lower voltage to be supplied to each cell selected for a write operation, as to facilitate a write function. The power line selection circuitry also locally converts the first voltage to a third voltage to be supplied to power lines in unselected sub arrays, the third voltage also being lower than the first voltage so as to facilitate dynamic leakage reduction.

20 Claims, 6 Drawing Sheets

SYSTEM AND METHOD FOR INTEGRATING DYNAMIC LEAKAGE REDUCTION WITH WRITE-ASSISTED SRAM ARCHITECTURE

BACKGROUND

The present invention relates generally to integrated circuit memory devices and, more particularly, to a system and method for integrating dynamic leakage reduction with a write-assisted SRAM architecture.

Memory devices are commonly employed as internal storage areas in a computer or other type of electronic equipment. One specific type of memory used to store data in a computer is random access memory (RAM), such as static RAM (SRAM) or dynamic RAM (DRAM), for example. RAM is typically used as main memory in a computer environment. RAM is generally volatile, in that once power is turned off, all data stored in the RAM is lost.

A typical SRAM device includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor (6T) cell, a pair of access transistors or pass gates (when activated by a word line) selectively couples the inverters to a pair of complementary bit lines. Other SRAM cell designs may include a different number of transistors, e.g., 4T, 8T, etc.

The design of SRAM cells has traditionally involved a compromise between the read and write functions of the memory cell to maintain cell stability, read performance and write performance. The transistors which make up the cross-coupled latch must be weak enough to be overdriven during a write operation, while also strong enough to maintain their data value when driving a bit line during a read operation. The access transistors that connect the cross-coupled cell nodes to the true and complement bit lines affect both the stability and performance of the cell. In one-port SRAM cells, a single pair of access transistors is conventionally used for both read and write access to the cell. The gates are driven to a digital value in order to switch the transistors between an on and off state. The optimization of an access for a write operation would drive the reduction of the on-resistance ($R_{on}$) for the device. On the other hand, the optimization of an access transistor for a read operation drives an increase in $R_{on}$ in order to isolate the cell from the bit line capacitance and prevent a cell disturb.

Existing approaches to address the design problems of dual voltage operation (for read versus write operations) and dynamic leakage control involve separate circuit solutions that increase device area. Accordingly, it would be desirable to be able to implement an SRAM architecture that provides both improved write assistance and dynamic leakage control, but in a manner reduces or minimizes the impact on the area consumed by devices.

SUMMARY

The foregoing discussed drawbacks and deficiencies of the prior art are overcome or alleviated by a system for integrating dynamic leakage reduction with a write-assisted SRAM architecture. In an exemplary embodiment, the system includes a plurality of SRAM cells arranged into rows and columns within one or more sub arrays; power line selection circuitry associated with each column of the one or more sub arrays, the power line selection circuitry controlled by a selection signal that selects the associated sub array for a read or write operation, and by a column write signal that selects one of the columns of each of the one or more sub arrays; wherein the power line selection circuitry is configured to locally convert a first voltage, corresponding to a cell supply voltage for a read operation of the SRAM cells, to a second voltage to be supplied to each SRAM cell selected for a write operation thereto, the second voltage being lower than the first voltage so as to facilitate a write function; and wherein the power line selection circuitry is further configured to locally convert the first voltage to a third voltage to be supplied to power lines in unselected sub arrays, the third voltage also being lower than the first voltage so as to facilitate dynamic leakage reduction.

In another embodiment, a method for integrating dynamic leakage reduction with a write-assisted SRAM architecture includes configuring a plurality of SRAM cells into rows and columns within one or more sub arrays; configuring power line selection circuitry associated with each column of the one or more sub arrays, the power line selection circuitry controlled by a selection signal that selects the associated sub array for a read or write operation, and by a column write signal that selects one of the columns of each of the one or more sub arrays; wherein the power line selection circuitry is configured to locally convert a first voltage, corresponding to a cell supply voltage for a read operation of the SRAM cells, to a second voltage to be supplied to each SRAM cell selected for a write operation thereto, the second voltage being lower than the first voltage so as to facilitate a write function; and wherein the power line selection circuitry is further configured to locally convert the first voltage to a third voltage to be supplied to power lines in unselected sub arrays, the third voltage also being lower than the first voltage so as to facilitate dynamic leakage reduction.

BRIEF DESCRIPTION OF THE DRAWINGS

Referring to the exemplary drawings wherein like elements are numbered alike in the several Figures.

DETAILED DESCRIPTION

Disclosed herein is a system and method for integrating dynamic leakage reduction with a write-assisted SRAM architecture. Briefly stated, the present architecture improves both a reduced write voltage level and a leakage savings through a common circuit that integrates a write-assist capability (i.e., operation of an SRAM array at selected first and second cell voltage levels, depending on a read or write) with dynamic leakage control. Currently, there are multiple solutions that separately address write-assist operation and dynamic leakage in SRAM arrays. However, each of these techniques are mutually exclusive and result in increases in area overhead in order to implement. Moreover, the same conventional solutions typically utilize additional voltage supplies to generate a write-assist voltage or a reference voltage for leakage reduction.

Figures 1A, 1B:
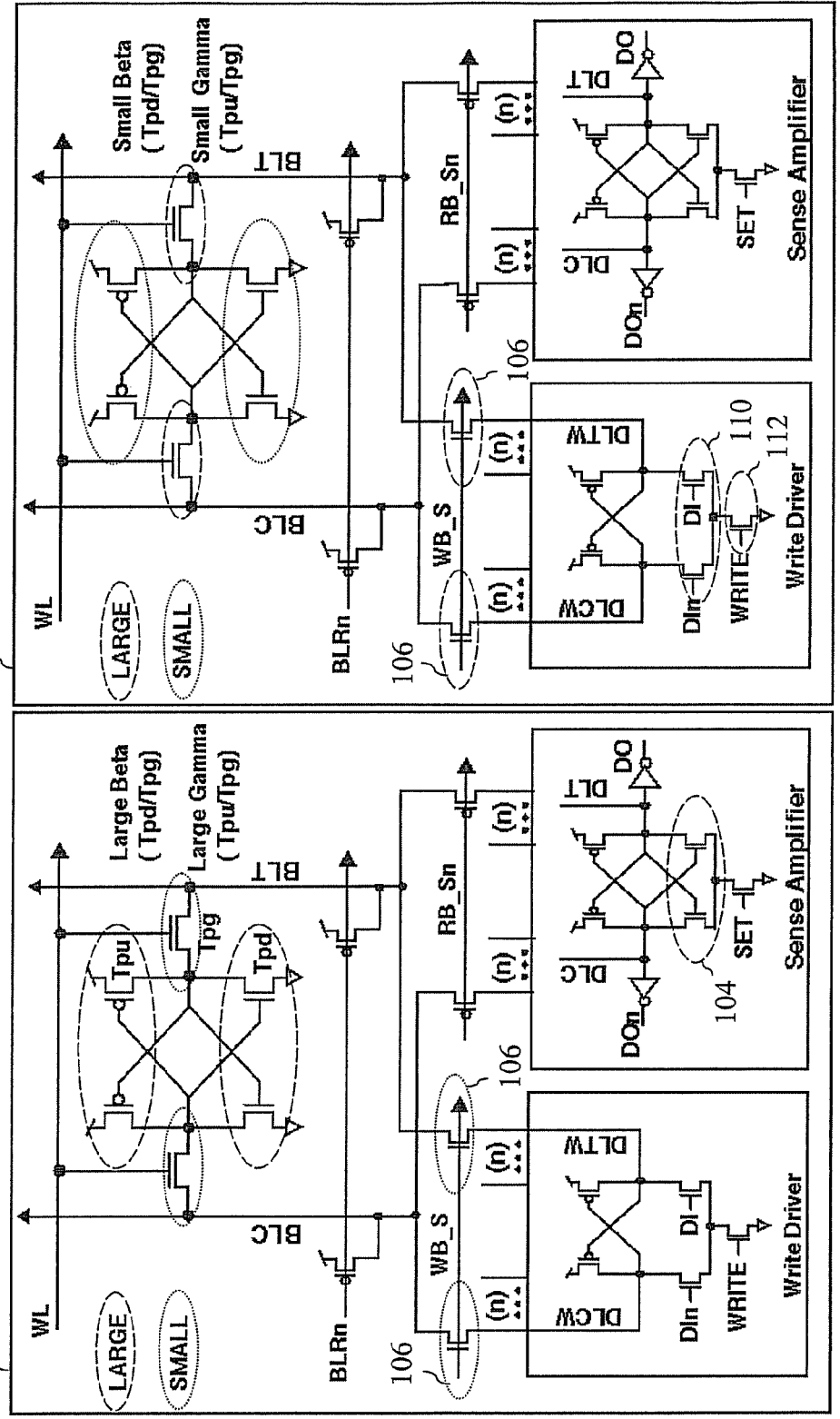
FIG. 1(a) is a schematic diagram of an existing SRAM system in which the transistor devices are sized so as to optimize the read operation.
FIG. 1(b) is a schematic diagram of an existing SRAM system in which the transistor devices are sized so as to optimize the write operation.

Referring initially to FIGS. 1(a) and 1(b), there is shown a pair of schematic diagrams illustrating an existing SRAM system in which the transistor devices are sized so as to optimize the read operation, in the case of FIG. 1(a), and the write operation, in the case of FIG. 1(b). First, in the read-optimized system 102 of FIG. 1(a), it will be seen that both the pull up transistors ($T_{pu}$) and the pull down transistors ($T_{pd}$) of the 6T SRAM cell have a relatively large conductive strength with respect to the access or "pass gate" transistors ($T_{pg}$) of the SRAM cell. That is, the SRAM cell of the read-optimized system 102 has both a large beta ratio ($\beta = T_{pd}/T_{pg}$) and a large gamma ratio ($\gamma = T_{pu}/T_{pg}$). In addition, it will also be seen from FIG. 1(a) that the pull down transistors 104 of the sense amplifier latch have a relatively large conductive strength, while the write driver switches 106 that couple the write driver data lines (DLTW, DLCW) to the cell bit lines (BLT, BLC) have a relatively small conductive strength.

In contrast, for the write-optimized system 108 of FIG. 1(b), it will be seen that both the pull up transistors ($T_{pu}$) and the pull down transistors ($T_{pd}$) of the 6T SRAM cell have a relatively small conductive strength with respect to the access transistors ($T_{pg}$) of the SRAM cell. That is, the SRAM cell of the write-optimized system 108 has both a small beta ratio ($\beta = T_{pd}/T_{pg}$) and a small gamma ratio ($\gamma = T_{pu}/T_{pg}$). In addition, it will also be seen from FIG. 1(b) that the pull down transistors 110 and NFET footer 112 of the write driver, as well as the switches 106 that couple the write driver data lines (DLTW, DLCW) to the cell bit lines (BLT, BLC) all have a relatively large conductive strength.

Figure 2:
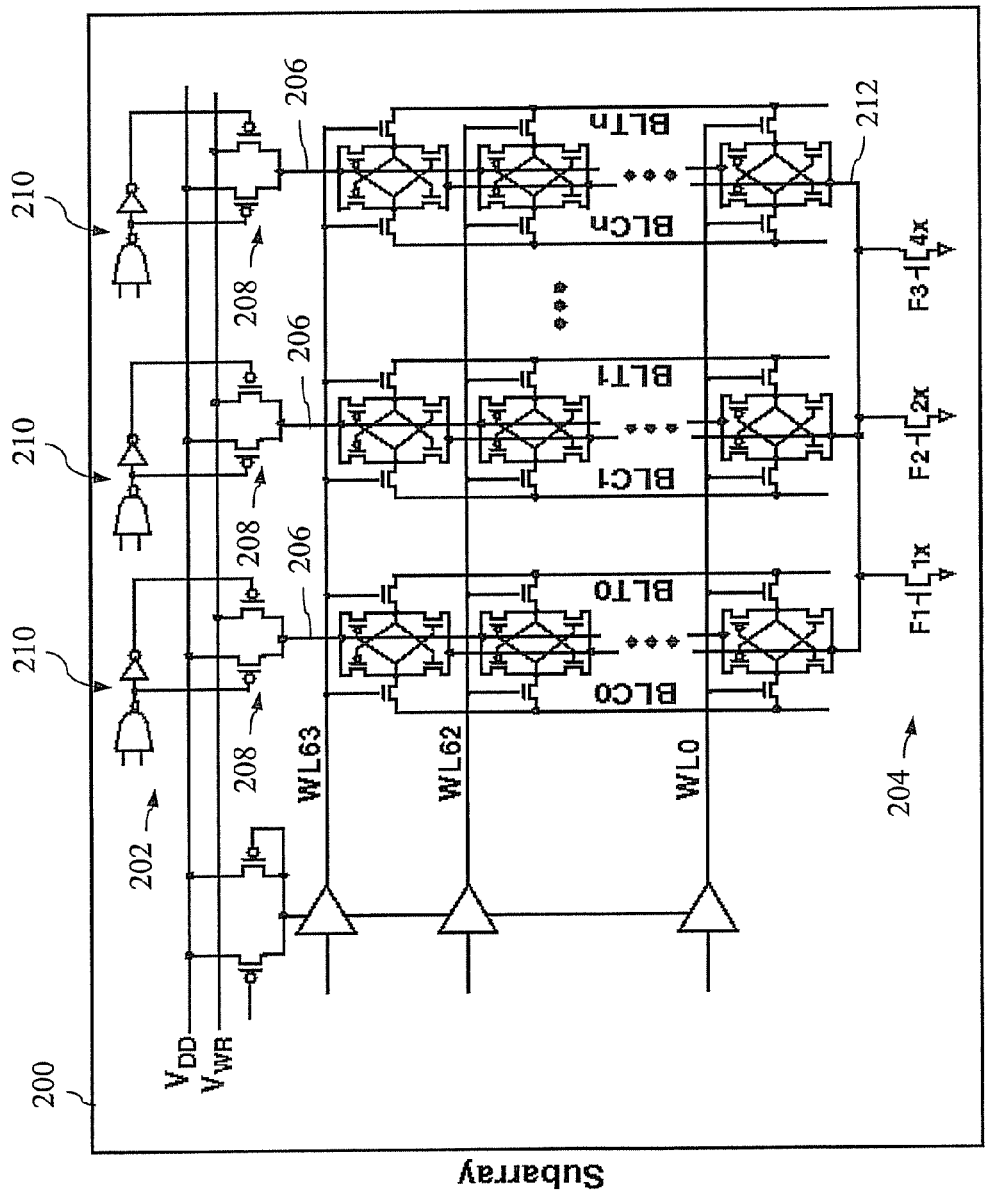
FIG. 2 is a schematic diagram of an existing SRAM system having separately configured write-assist and leakage savings features.

As a result of the inherent trade-off in device sizing with respect to optimizing both read and write operations, FIG. 2 is a schematic diagram illustrating one existing approach for implementing a sub array 200 in an SRAM system (e.g., having 64 word lines) including both write-assist circuitry 202 and leakage savings circuitry 204. Each SRAM column has its own individual power line with the upper portion 206 thereof coupled to a pair of PFET select transistors, generally depicted at 208. A first of the PFET select transistor pair connects the power line to the nominal supply or rail voltage ($V_{DD}$) for normal read or unselected (and half-selected) operations. However, for write operations, the selected SRAM column for writing is connected to an external write power supply ($V_{WR}$) through the second of the PFET select transistor pair, wherein the external power supply voltage $V_{WR}$ is lower than the nominal rail voltage $V_{DD}$. For example, $V_{WR}$ may be a voltage threshold value ($V_t$) of a PFET/NFET lower than $V_{DD}$. Alternatively, the lower write voltage $V_{WR}$ could be generated on-chip, but at a cost of increased device area. In addition, each column has unique decode logic 210 for the PFET select transistors pair 208 so that the lower voltage ($V_{WR}$) is supplied only to those columns that are actually writing.

FIG. 2 further illustrates the separate leakage savings circuitry 204 coupled between a common terminal 212 of a virtual ground node and ground. More specifically, the circuitry 204 includes a plurality of binary weighted "sleep" NFETs controlled by signals F1, F2, F3, etc., to provide optimum leakage savings without compromising data retention. By using a "soft" ground node (i.e., terminal 212), the degree to which the voltage across the SRAM cells is reduced becomes adjustable in accordance with the control signals applied to the gates of the sleep NFETs.

As indicated above, however, the separate circuit devices of FIG. 2 undesirably increase the overall device area, by about 8% with respect to arrays not providing write assistance or dynamic leakage control. Moreover, with respect to just the write assist circuitry 202, each sub array 200 of the system includes individual logic devices 208, 210 for each column.

Figure 3:
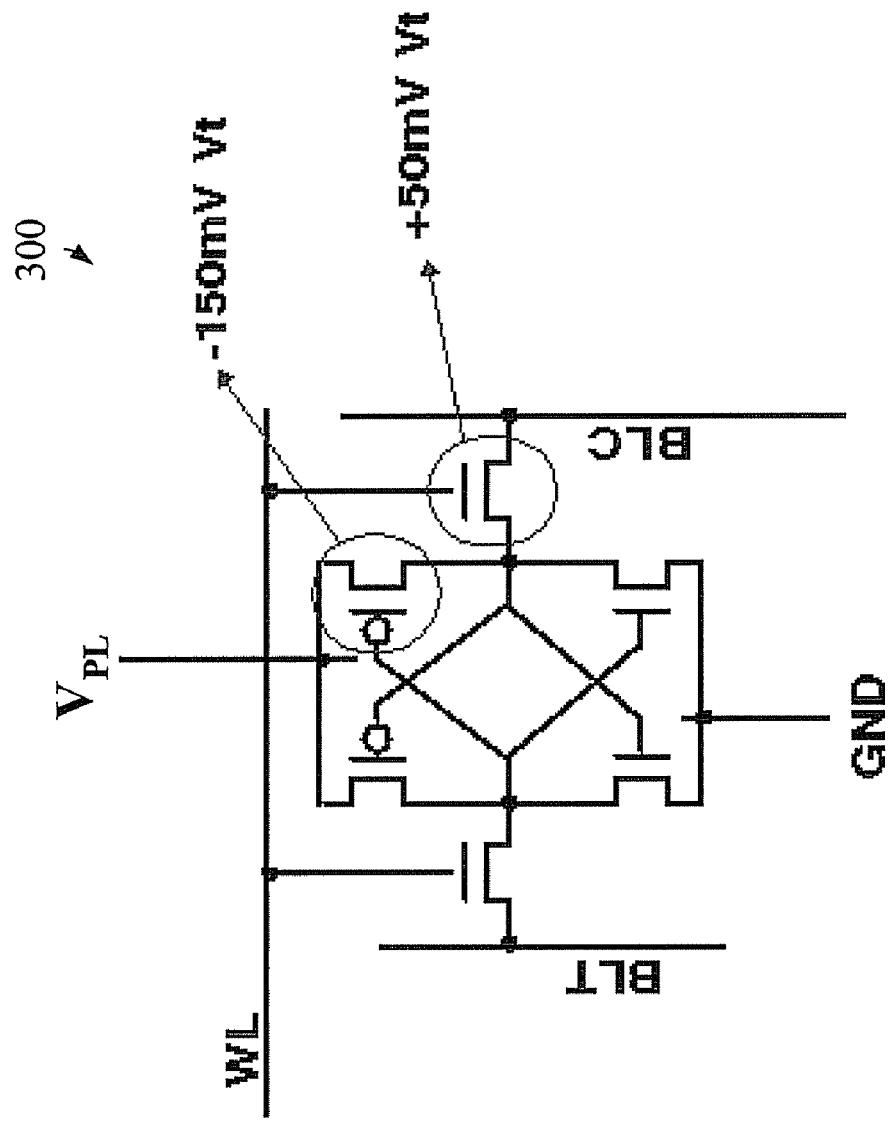
FIG. 3 is a schematic diagram of an SRAM cell, in accordance with an embodiment of the invention.

Accordingly, the embodiments disclosed herein introduce an SRAM architecture with a single circuit that integrates a write-assist feature with dynamic leakage reduction to provide desired improvement in voltage margins, thereby resulting in improved device real estate savings with respect to conventional approaches. An exemplary SRAM cell 300 suitable for use in the architecture is illustrated in FIG. 3. As shown, the cell 300 is optimized for a read operation, wherein the beta ratio is made larger with respect to conventional designs, and the PFET pull-up devices are also made stronger. In one exemplary embodiment, the threshold voltage $V_t$ of the pull up transistors of the cell 300 is decreased by about 150 mV with respect to a balanced device while the threshold voltage of the access transistor is increased by about 50 mV with respect to a balanced device. Thus configured, it would not be practically possible to write to the cell 300 without the use of write-assist features (reduced supply voltage with respect to $V_{DD}$). On the other hand, the cell 300 is configured to provide excellent read stability margins.

As also shown in FIG. 3, the power line voltage $V_{PL}$ applied to the cell 300 will vary, depending upon whether the cell is being read, written to, or the sub array of the cell is not activated.

Figure 4:
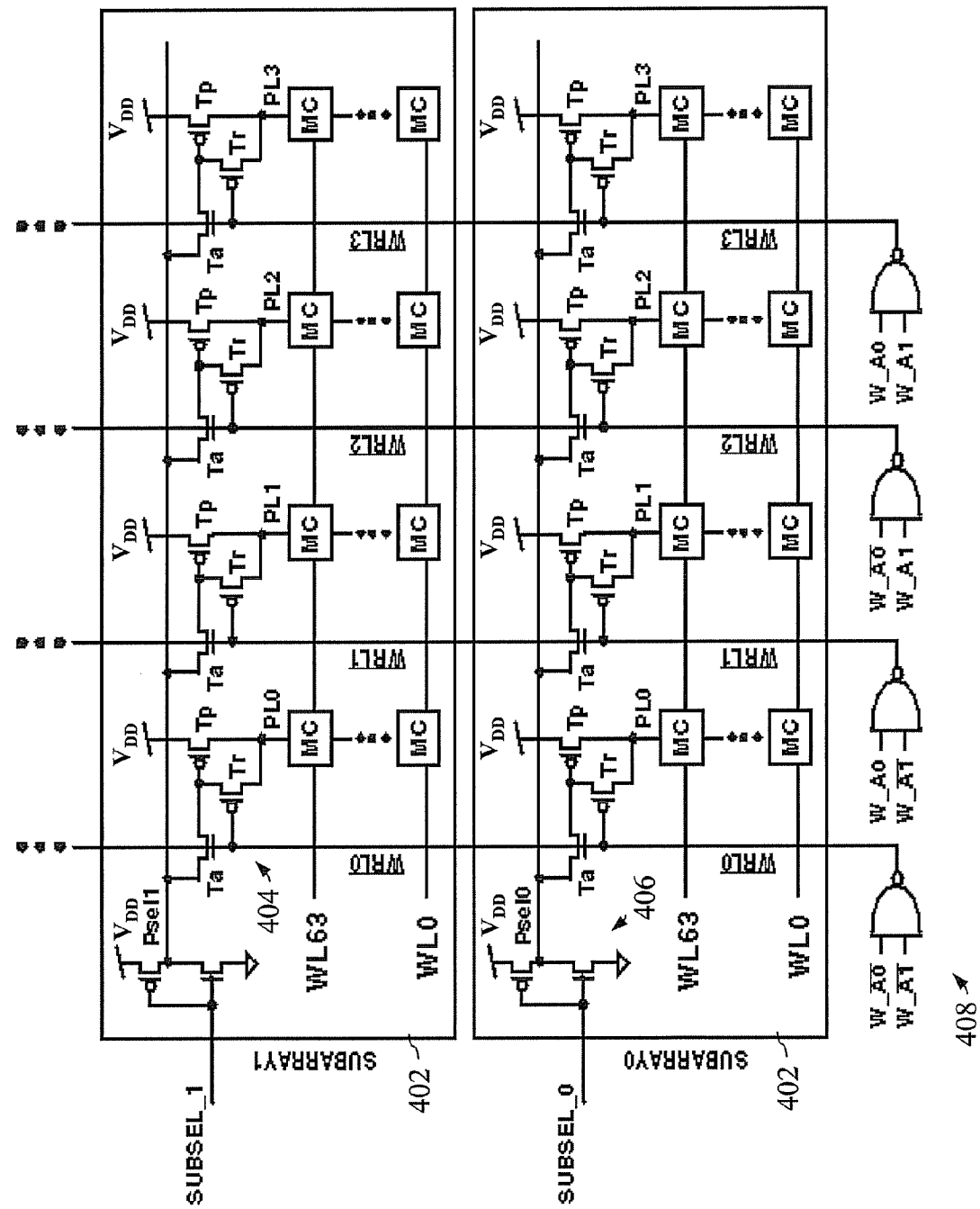
FIG. 4 is a schematic diagram of a system for integrating dynamic leakage reduction with a write-assisted SRAM architecture, in accordance with an embodiment of the invention.

Referring now to FIG. 4, there is shown a schematic diagram of a system 400 for integrating dynamic leakage reduction with a write-assisted SRAM architecture, in accordance with an embodiment of the invention. The SRAM array is divided into sub arrays which are independently activated by selection signals "SUBSEL_n". For ease of illustration, two such sub arrays are depicted in FIG. 4 (sub array 0, sub array 1, selected by sub array decode signals, SUBSEL_0 and SUBSEL_1, respectively). However, the number of actual sub arrays in an ASIC compilable SRAM may vary from 1 to as many as 16, for example.

The sub arrays 402 are further divided into columns that receive power from an individual power line (PL0-PL3) coupled to a cell voltage supply ($V_{DD}$) through a header PFET Tp. The voltage level supplied to the SRAM cells (labeled "MC" in FIG. 4) coupled to a given power line is controlled by both the SUBSEL_n sub array decode signal and by the write lines (WRL0-WRL3) decoded from column select addresses. It will be noted that the write lines are common across all sub arrays 402 in order to save area. In the exemplary embodiment depicted, each sub array column has a power line selection circuit 404 (transistors Ta, Tr, Tp) responsive to the associated "SUBSEL_n" decode signal and the associated "WRLn" column write line. An inverter device 406 associated with each SUBSEL_n input generates a "Pseln" signal on a control line common to each transistor Ta of the power line selection circuits 404. The selection circuit 404 passes $V_{DD}$ to the local power line for a read operation, or generates $V_{DD}$-$V_t$ locally and passes it to the power line for a write operation as described more fully below.

During a read cycle, the "WRLn" column write lines are high (which represents a deactivated state) and a given sub array decode signal (e.g., SUBSEL_0) is enabled so as to discharge the associated "Pseln" (e.g., Psel0) node. This will also discharge the gates of each Tp device in the selected sub array (through conductive NFET Ta) so as to couple the power line to a full $V_{DD}$ voltage.

On the other hand, for a write operation in a selected sub array 402, any one column may be written to without affecting the voltage level of the half-selected columns. More specifically, write decode address circuitry 408 is used to select one of the WRLn column write lines to discharge. This isolates the gate of Tp from the grounded Pseln line (through deactivation of NFET Ta) and enables PFET Tr to shunt the gate and drain of Tp. As a result, PFET Tp acts as a diode, thereby enabling the partial discharge of the selected power line and lowering the voltage applied to the cell from $V_{DD}$ in an amount by the threshold voltage of Tp ($V_{DD}$-$V_T$Tp). Stated another way, the lower write-assist voltage is locally generated from the supply rail voltage $V_{DD}$, as opposed to providing a separate and possibly off-chip voltage.

It will also be noted that the write decode address circuitry 408 for the write select lines WRLn is shared with all sub arrays to minimize area overhead (as opposed to the system of FIG. 2 where each column of each sub array has decode circuitry 210). In addition, unselected sub arrays are placed in a leakage-savings mode without compromising data retention. As further depicted in FIG. 4, the Psel lines for unselected sub arrays are driven to $V_{DD}$, since those SUBSEL signals are low and thus the corresponding inverters 406 drive the Psel lines to $V_{DD}$. The gate of NFET device Ta in unselected write columns is active to weakly pass $V_{DD}$, less the threshold voltage of NFET Ta (i.e., $V_{DD}$-$V_T$Ta) to the gate of header device Tp and decrease its drive. As a result, the voltage on the unselected power lines of unselected sub arrays drops by an amount corresponding to the threshold voltage of NFET Ta.

Power lines in unselected sub arrays may see a small change in voltage as common write lines may be activated during write cycles to selected sub arrays. In this case, the gate voltage of PFET header device Tp may switch from $V_{DD}$-$V_T$Ta to $V_{DD}$-$V_T$Tp. That is, the voltage on the gate of Tp temporarily transitions from the voltage on the Psel line to the cell power line. However, this small transient change only lasts during the short WL activation duration.

Figure 5:
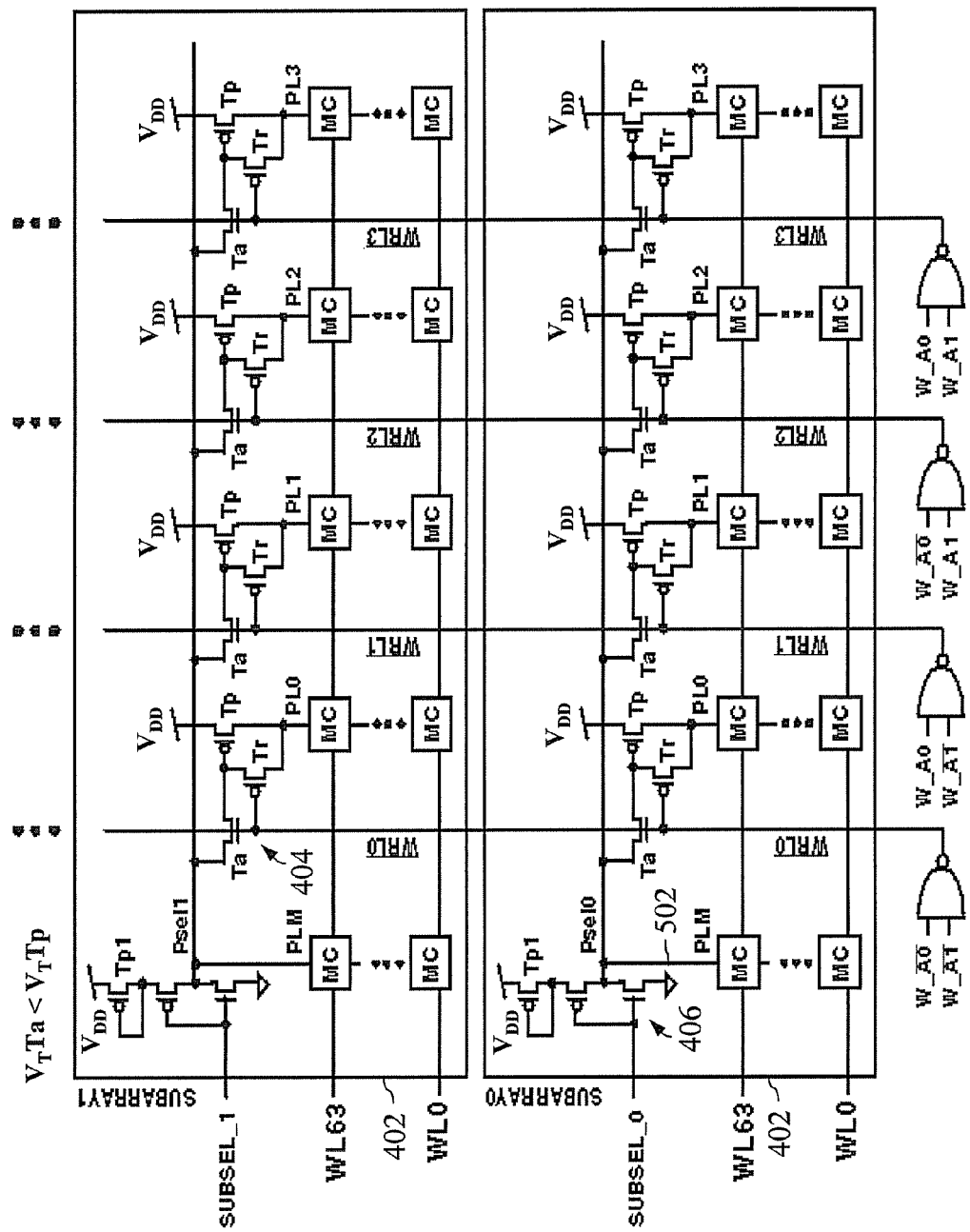
FIG. 5 is a schematic diagram of a system for integrating dynamic leakage reduction with a write-assisted SRAM architecture, in accordance with an alternative embodiment of the invention.

FIG. 5 is a schematic diagram of a system 500 for integrating dynamic leakage reduction with a write-assisted SRAM architecture, in accordance with an alternative embodiment of the invention. The embodiment of FIG. 5 addresses the change of gate voltage of device Tp for unselected sub arrays while selected sub arrays are writing. More specifically, a diode configured PFET Tp 1 is coupled between the inverter 406 and the supply rail $V_{DD}$. Thereby, the corresponding Pseln lines are driven to $V_{DD}$-$V_T$Tp1 for unselected sub arrays, instead of to $V_{DD}$. In addition, low $V_T$ devices are used for NFET Ta so that a full $V_{DD}$-$V_T$Tp1 voltage is established at the gate of PFET Tp. Further, a mimic power line (PLM) is associated with dummy cells in order to preserve the ratio between PFET Tp and the leakage for each column. As the column write lines WRLn switch, there is no change in Tp gate voltage. Accordingly, the power lines are kept at the same potential during a selected write cycle mode or an unselected leakage savings mode.

Figure 6:
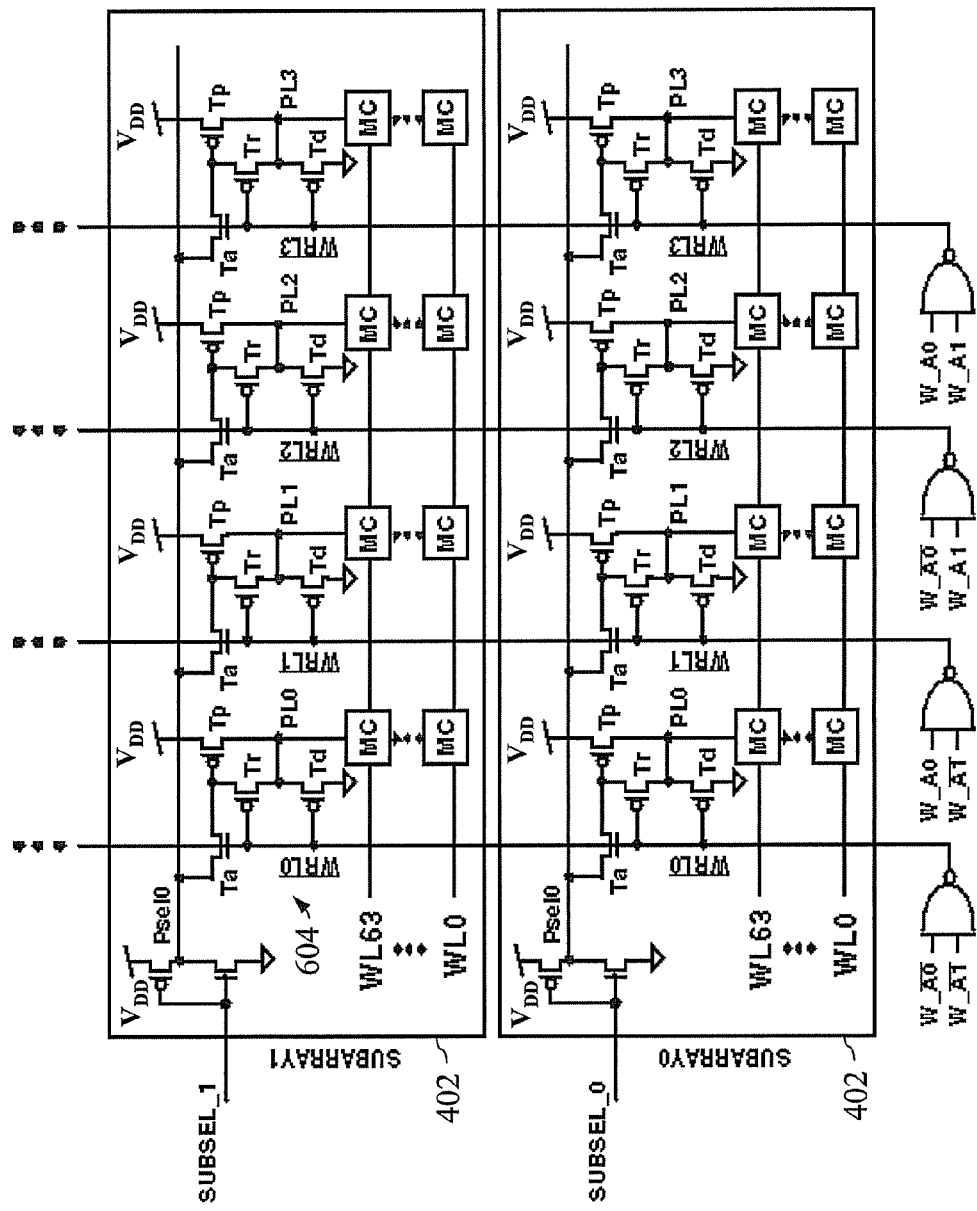
FIG. 6 is a schematic diagram of a system for integrating dynamic leakage reduction with a write-assisted SRAM architecture, in accordance with still an alternative embodiment of the invention.

Finally, FIG. 6 is a schematic diagram of a system 600 for integrating dynamic leakage reduction with a write-assisted SRAM architecture, in accordance with still an alternative embodiment of the invention. The system 600 is configured to further assist with the discharge of the cell power lines during write operations. More specifically, the power line selection circuits 604 include an additional PFET device Td added between the cell power line and ground, with the gate of Td also coupled to the associated column write line. Upon activation of Td during a write operation, the associated power lines quickly drop to $V_{DD}$-$V_T$Tp during write operations. This additional PFET device may be desirable for technologies where cell leakage currents or cell transient write-currents may be too small to discharge the PL node quickly enough to assist the write operation.

Thus configured, it is estimated that the disclosed SRAM architecture embodiments achieve about 80% of the leakage reduction benefits of the separately configured sleep footer NFETs in the architecture of FIG. 2 without the area penalty associated therewith. For example, it is further estimated that write-assist circuits and the sleep-NFETs of the prior art add about 8% to SRAM area, whereas the present embodiments add only about 2-3% to SRAM area and therefore offer a denser solution with about 80% of the leakage reduction benefits. Furthermore, the SRAM architecture embodiments provide both improved voltage range and improved reduction in leakage current using a single integrated circuit scheme for write-assist and leakage control, which decreases device complexity and without the use of additional/external voltage supplies.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for integrating dynamic leakage reduction with a write-assisted SRAM architecture, comprising:

a plurality of SRAM cells arranged into rows and columns within one or more sub arrays;

power line selection circuitry associated with each column of the one or more sub arrays, the power line selection circuitry controlled by a selection signal that selects the associated sub array for a read or write operation, and by a column write signal that selects one of the columns of each of the one or more sub arrays;

wherein the power line selection circuitry is configured to locally convert a first voltage, corresponding to a cell supply voltage for a read operation of the SRAM cells, to a second voltage to be supplied to each SRAM cell selected for a write operation thereto, the second voltage being lower than the first voltage so as to facilitate a write function; and wherein the power line selection circuitry is further configured to locally convert the first voltage to a third voltage to be supplied to power lines in unselected sub arrays, the third voltage also being lower than the first voltage so as to facilitate dynamic leakage reduction.

2. The system of claim 1, wherein the power line selection circuitry further comprises a first PFET device coupled between a voltage supply rail and a power line associated with a column of the SRAM cells, wherein the second voltage to be supplied for a write operation is less than the first voltage by an amount corresponding to the threshold voltage of the first PFET device.

3. The system of claim 2, wherein the power line selection circuitry further comprises:
a second PFET device coupled between a gate terminal of the first PFET device and the power line, with a gate terminal of the second PFET device controlled by the associated column write signal; and
an NFET device coupled between the gate terminal of the first PFET device and a control line, the voltage on the control line representing a logical complement of the selection signal.

4. The system of claim 3, wherein the third voltage to be supplied to power lines in unselected sub arrays is less than the first voltage by an amount corresponding to the threshold voltage of the NFET device.

5. The system of claim 3, wherein the power line selection circuitry further comprises:
an inverter device having an input coupled to the selection signal and an output coupled to the control line; and
a diode configured PFET coupled between the inverter device and the voltage supply rail such that a logical high value on the control line corresponds to the first voltage less the threshold voltage of the diode configured PFET.

6. The system of claim 5, wherein the third voltage to be supplied to power lines in unselected sub arrays is equal to the second voltage to be supplied to each SRAM cell selected for a write operation thereto.

7. The system of claim 5, wherein the threshold voltage of the NFET device is less than the threshold voltage of the first PFET device.

8. The system of claim 5, further comprising a mimic power line coupled to the control line, the mimic line supplying a column of dummy array cells.

9. The system of claim 3, wherein the power line selection circuitry further comprises a third PFET device coupled between the power line and ground, the third PFET device configured to assist in a transition in the power line voltage between the first voltage and the second voltage during a write operation.

10. The system of claim 1, further comprising a single set of column write select address decode circuitry common to each of the one or more sub arrays.

11. A method for integrating dynamic leakage reduction with a write-assisted SRAM architecture, the method comprising:
configuring a plurality of SRAM cells into rows and columns within one or more sub arrays;
configuring power line selection circuitry associated with each column of the one or more sub arrays, the power line selection circuitry controlled by a selection signal that selects the associated sub array for a read or write operation, and by a column write signal that selects one of the columns of each of the one or more sub arrays;

wherein the power line selection circuitry is configured to locally convert a first voltage, corresponding to a cell supply voltage for a read operation of the SRAM cells, to a second voltage to be supplied to each SRAM cell selected for a write operation thereto, the second voltage being lower than the first voltage so as to facilitate a write function; and
wherein the power line selection circuitry is further configured to locally convert the first voltage to a third voltage to be supplied to power lines in unselected sub arrays, the third voltage also being lower than the first voltage so as to facilitate dynamic leakage reduction.

12. The method of claim 11, further comprising configuring a first PFET device coupled between a voltage supply rail and a power line associated with a column of the SRAM cells, wherein the second voltage to be supplied for a write operation is less than the first voltage by an amount corresponding to the threshold voltage of the first PFET device.

13. The method of claim 12, further comprising:
configuring a second PFET device coupled between a gate terminal of the first PFET device and the power line, with a gate terminal of the second PFET device controlled by the associated column write signal; and
configuring an NFET device coupled between the gate terminal of the first PFET device and a control line, the voltage on the control line representing a logical complement of the selection signal.

14. The method of claim 13, wherein the third voltage to be supplied to power lines in unselected sub arrays is less than the first voltage by an amount corresponding to the threshold voltage of the NFET device.

15. The method of claim 13, further comprising:
configuring an inverter device having an input coupled to the selection signal and an output coupled to the control line; and
configuring a diode configured PFET coupled between the inverter device and the voltage supply rail such that a logical high value on the control line corresponds to the first voltage less the threshold voltage of the diode configured PFET.

16. The method of claim 15, wherein the third voltage to be supplied to power lines in unselected sub arrays is equal to the second voltage to be supplied to each SRAM cell selected for a write operation thereto.

17. The method of claim 15, wherein the threshold voltage of the NFET device is less than the threshold voltage of the first PFET device.

18. The method of claim 15, further comprising configuring a mimic power line coupled to the control line, the mimic line supplying a column of dummy array cells.

19. The method of claim 13, further comprising configuring a third PFET device coupled between the power line and ground, the third PFET device configured to assist in a transition in the power line voltage between the first voltage and the second voltage during a write operation.

20. The method of claim 11, further comprising configuring a single set of column write select address decode circuitry common to each of the one or more sub arrays.

* * * * *